(12) United States Patent
Simms

(10) Patent No.: US 10,321,213 B2
(45) Date of Patent: Jun. 11, 2019

(54) REMOTE SPEAKER MICROPHONE WITH TOUCH VOLUME CONTROL

(71) Applicant: MOTOROLA SOLUTIONS, INC., Chicago, IL (US)

(72) Inventor: Matthew E. Simms, Davie, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 145 days.

(21) Appl. No.: 15/606,099

(22) Filed: May 26, 2017

(65) Prior Publication Data

US 2018/0343513 A1    Nov. 29, 2018

(51) Int. Cl.
H03G 3/00 (2006.01)
H04R 1/08 (2006.01)
H03G 3/02 (2006.01)
G06F 3/16 (2006.01)

(52) U.S. Cl.
CPC ............. *H04R 1/083* (2013.01); *G06F 3/165* (2013.01); *H03G 3/02* (2013.01); *H04R 2420/07* (2013.01)

(58) Field of Classification Search
CPC ........................................................ H03G 3/00
See application file for complete search history.

(56) References Cited

U.S. PATENT DOCUMENTS

| 7,702,368 | B2 | 4/2010 | Lim | |
|---|---|---|---|---|
| 8,913,759 | B2 | 12/2014 | Park | |
| 2013/0315419 | A1* | 11/2013 | Chien | H03G 7/00 381/98 |
| 2015/0212639 | A1* | 7/2015 | Wallace | G06F 3/04883 345/173 |
| 2015/0363027 | A1* | 12/2015 | Hu | G06F 1/163 345/174 |
| 2016/0026324 | A1 | 1/2016 | Wu et al. | |
| 2017/0099534 | A1* | 4/2017 | Starobin | H04R 1/026 |
| 2018/0074639 | A1* | 3/2018 | Powell | G06F 3/0416 |

FOREIGN PATENT DOCUMENTS

JP            10065764 A        3/1998

* cited by examiner

*Primary Examiner* — Olisa Anwah
(74) *Attorney, Agent, or Firm* — Perry + Currier, Inc.

(57) ABSTRACT

A remote speaker microphone with touch volume control is provided. The remote speaker microphone includes a housing; a microphone; a speaker; and an interface configured to connect the speaker and the microphone. The remote speaker microphone further includes a touch sensor configured to, in response to receiving touch input, control a volume level of the speaker from a first volume level to a lower volume level, the first volume level being one of a plurality of discrete volume levels.

17 Claims, 8 Drawing Sheets

REMOTE SPEAKER MICROPHONE WITH TOUCH VOLUME CONTROL

BACKGROUND OF THE INVENTION

Remote speaker microphones are generally used with portable radios used by emergency workers, tour operators, and the like. Such remote speaker microphones generally convey audio from the radio through a speaker. Furthermore, the remote speaker microphone is often worn, via a clip, adjacent to a shoulder of a user, for easy access of use. However, when the user of the remote speaker microphone is in certain situations, for example a police officer speaking with the public, and the like, or a tour operator using a public-address system, the audio from the remote speaker microphone can be inappropriate and/or unwanted and/or interfere with the public-address system. Presently, a user manually blocks the speaker of the remote speaker microphone either by placing a hand, or wrist, over the speaker and/or by pressing the speaker into their shoulder. In both instances, the user can still hear the audio, but it is greatly muted because of the pressure they apply to the speaker.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
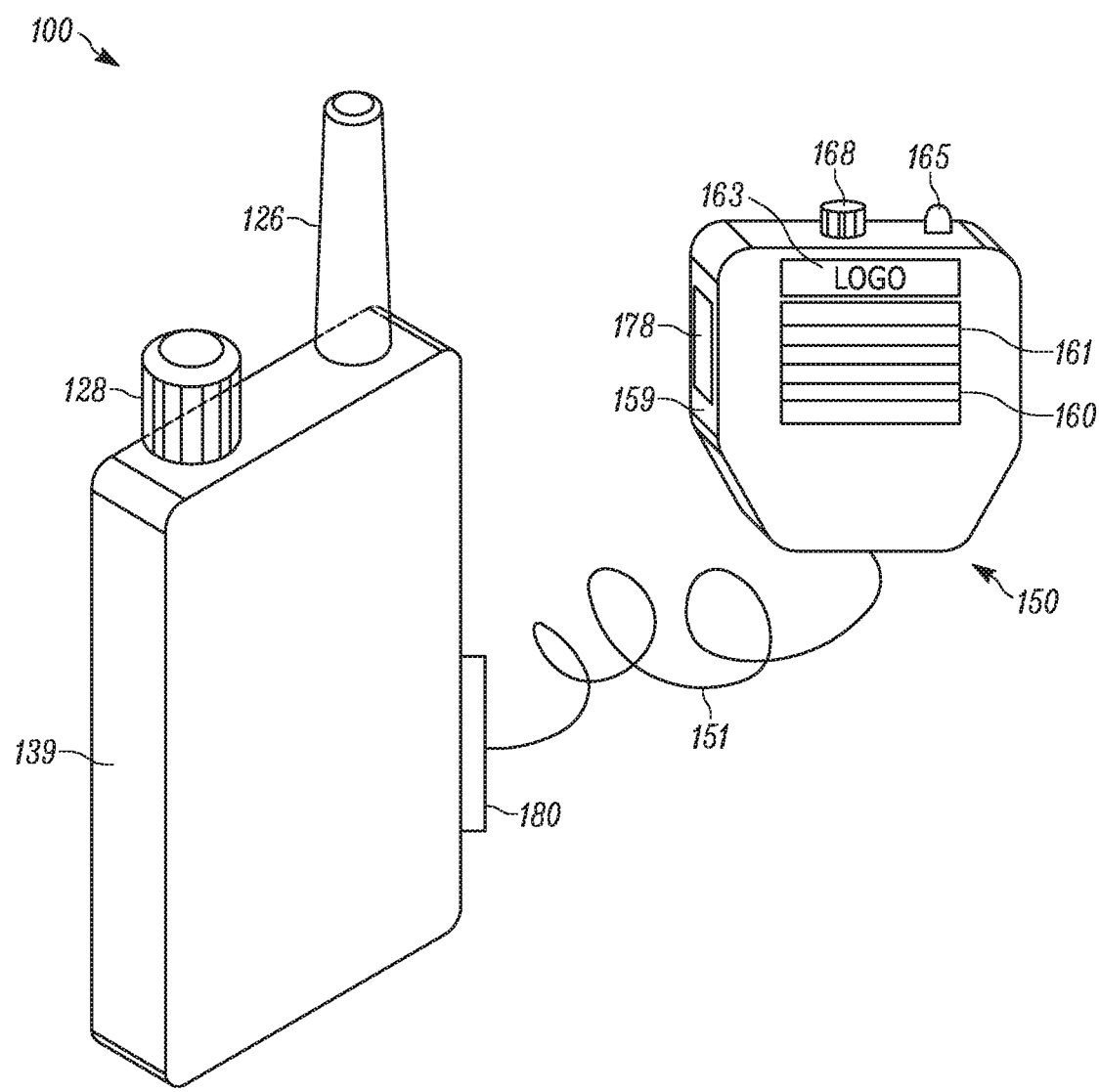
FIG. 1 a perspective view of a communication device with a remote speaker microphone with touch volume control in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

The present specification provides a remote speaker microphone apparatus comprising: a housing; a microphone; a speaker; an interface configured to connect the speaker and the microphone; and, a touch sensor configured to, in response to receiving touch input, control a volume level of the speaker from a first volume level to a lower volume level, the first volume level being one of a plurality of discrete volume levels.

The present specification further provides a remote speaker microphone apparatus comprising: a housing; a microphone; a speaker; an interface configured to connect the speaker and the microphone; a mechanically actuated switch configured to, in response to receiving input, select a volume level of the speaker from among a first ordered list of pre-determined volume levels; and a touch sensor configured to, in response to receiving touch input, select the volume level of the speaker from among a second ordered list of pre-determined volume levels different from the first ordered list of pre-determined volume levels.

The present specification further provides a method for controlling a remote speaker microphone apparatus, method comprising: receiving, using a touch sensor at the remote speaker microphone apparatus, touch input; and, in response, controlling a volume level of a speaker of the remote speaker apparatus from a first volume level to a lower volume level, the first volume level being one of a plurality of discrete volume levels.

Attention is directed to FIG. 1, which depicts a perspective view of a communication device 100, interchangeably referred to hereafter as the device 100. The device 100 includes an antenna 126 for communicating radio signals, a mechanically actuated switch 128 configured to control volume, as described in more detail below. It is furthermore understood that certain components of the device 100 depicted in FIG. 1 are housed by and/or integrated with an external housing 139 of the device 100. While not depicted, the device 100 may optionally comprise a display, a microphone, a speaker and/or any other components and/or external components used with communication devices and/or other radio devices.

Furthermore, the device 100 is in electrical communication with a remote speaker microphone apparatus (also referred to as remote speaker microphone 150) via a cable 151. In general, the cable 151 conveys one or more of electrical signals and data between the device 100 and the remote speaker microphone 150. Furthermore, while the device 100 and the remote speaker microphone 150 are described herein as being in communication via the cable 151, in other embodiments, the device 100 and the remote speaker microphone 150 are in wireless communication.

The remote speaker microphone 150 generally comprises a housing 159, a microphone 160, a speaker 161, and a touch sensor 163 configured to, in response to receiving touch input, control a volume level of the speaker 161 from a first volume level to a lower volume level, the first volume level being one of a plurality of discrete volume levels. The touch sensor 163 can comprise a capacitive touch sensor and/or a resistive touch sensor, and/or a pressure sensitive touch sensor. Indeed, in some embodiments the touch sensor 163 is actuatable by a hand wearing a glove, and the like.

As depicted, the remote speaker microphone 150 further comprises an optional visual indicator 165 configured to provide a status of the volume level of the speaker 161. As depicted, the visual indicator 165 comprises one or more of a light, a light emitting diode, and the like. However, the visual indicator 165 may alternatively comprise a display device, and the like.

As depicted, the remote speaker microphone 150 further comprises an optional mechanically actuated switch 168 configured to, in response to receiving input, select the volume level of the speaker 161 from among the plurality of discrete volume levels, the plurality of discrete volume levels comprising an ordered list of pre-determined volume levels. As depicted, the switch 168 comprises a rotary switch, however the switch 168 can include, but is not limited to, one of a rotary switch, a rocker switch, a toggle switch and the like. When the switch 168 comprises a rotary switch, the rotary switch is one of a continuous rotation type (e.g. a rotary switch that is continuously rotatable in either direction without stops) or a type without continuous rotation, having stops (e.g. mechanical stops), for example a stop corresponding to a highest volume level and a stop corresponding to a lowest volume level; furthermore, when the switch 168 comprises a rotary switch of a type without continuous rotation, having stops, each of the plurality of discrete volume levels is encoded to a particular angular position of the rotary switch.

As depicted, the remote speaker microphone 150 further comprises an input device 178, located, for example, on a side of the housing 159, configured to control the remote speaker microphone 150 between a microphone mode and a speaker mode. The input device 178 comprises a button, an actuator, and the like. For example, in the speaker mode, the remote speaker microphone 150 is operable to provide audio, for example as received at the device 100 in signals received by the antenna 126, at the speaker 161; and, in the microphone mode, the remote speaker microphone 150 is operable to convey audio from microphone 160 to the device 100 for transmission by the antenna 126. In general, the speaker mode may be a default mode of the remote speaker microphone 150, and the remote speaker microphone 150 is configured to switch to the microphone mode only when the input device 178 is actuated. However, in other embodiments, the remote speaker microphone 150 switches between the microphone mode and the speaker mode at successive actuations of the input device 178. Furthermore, in the microphone mode, in some implementations the speaker 161 continues to provide audio received from the device 100, while, in other implementations, in the microphone mode, the speaker 161 is muted.

While not depicted, the remote speaker microphone 150 may comprise a clip, and the like, configured to clip the remote speaker microphone 150 to clothing, a holster, and the like, for example adjacent a shoulder of a user. Such a clip, and the like, can be located on a rear of the remote speaker microphone 150 and/or on a side opposite the speaker 161 and microphone 160.

While the speaker 161 and microphone 160 are depicted as being adjacent each other, in other embodiments, the speaker 161 and microphone 160 are separate from each other. However, in depicted example embodiments, the speaker 161 and microphone 160 are located behind a common grill structure, for example a common speaker grill.

Furthermore, as depicted, the touch sensor 163 is integrated into a surface of the housing 159 adjacent the speaker 161. Furthermore, as depicted, the touch sensor 163 is integrated into a portion of the surface of the housing 159 that includes a logo, and the like, including, but not limited to, a logo of a manufacturer of the remote speaker microphone 150. Such a logo, and the like, is optional. In other embodiments, the portion of the surface of the housing 159 that includes the touch sensor 163 includes an identifier of the location of the touch sensor 163 including, but not limited to, a textual identifier, and/or a graphical identifier, for example printed on the housing; such an identifier may include a word (e.g. "mute") and/or a graphic that indicates that touching that portion of the surface of the housing 159 will mute the speaker 161. In yet further embodiments, the portion of the surface of the housing 159 that includes the touch sensor 163 is textured such that the location of the touch sensor 163 may be determined using touch alone.

When the remote speaker microphone 150 is in communication with the device 100 using the cable 151, the cable 151 may be provided with the remote speaker microphone 150, and the cable 151 may be removably connectable to the device 100 using, for example, a suitable port (not depicted) at the device 100 and a complementary connector 180 at a device-end of the cable 151. In other words, the device 100 and the remote speaker microphone 150 may be provided and/or sold separately.

In any event, the components of the device 100 and the remote speaker microphone 150 as depicted in FIG. 1 are accessible to, and/or visible to, a user of the device 100 and the remote speaker microphone 150.

Figure 2:
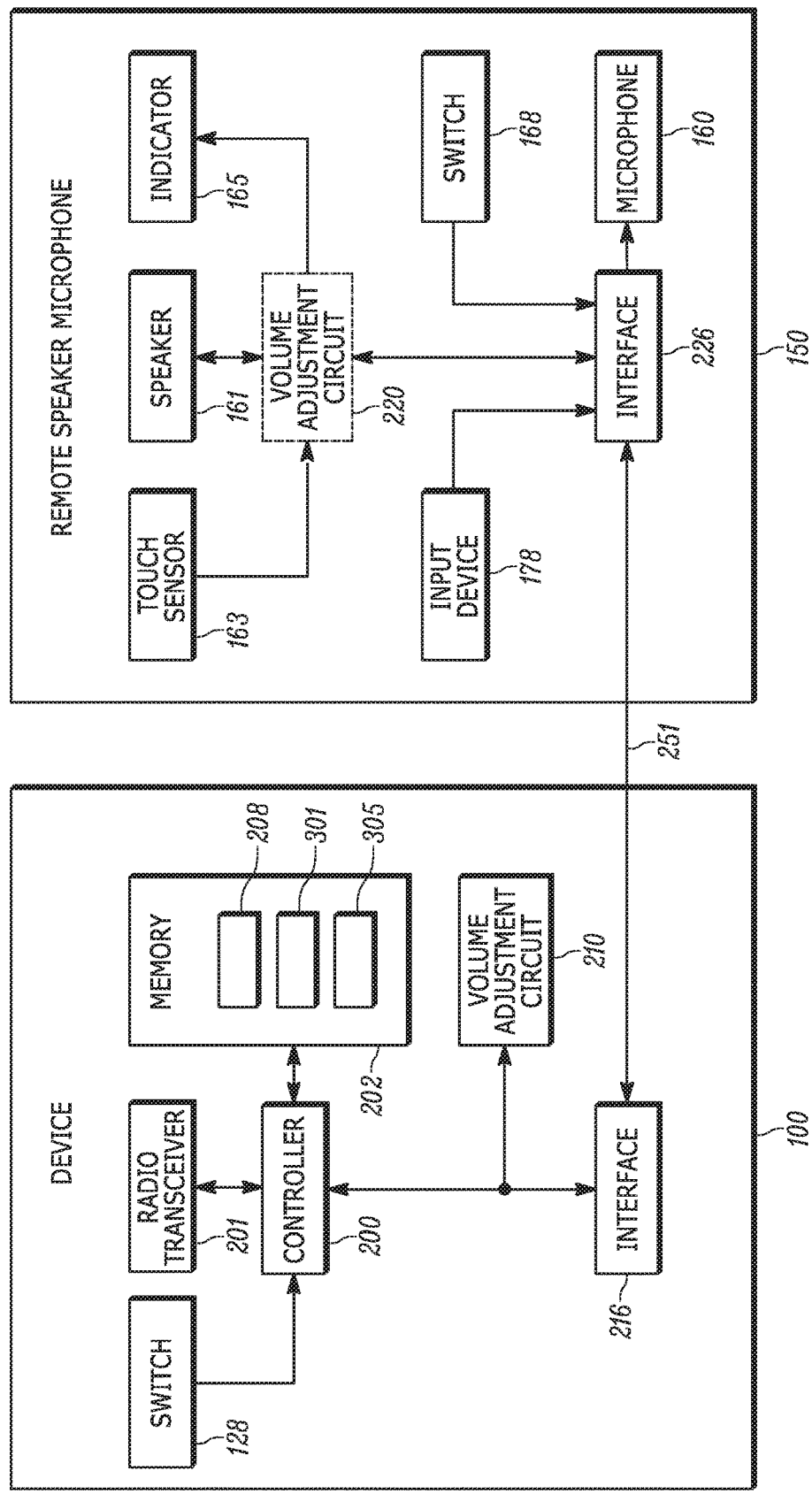
FIG. 2 is a schematic view of the device of FIG. 1 in accordance with some embodiments.

Attention is next directed to FIG. 2 which depicts a schematic block diagram of the device 100 and the remote speaker microphone 150 in communication with each other. The device 100 further comprises: controller 200; a radio transceiver 201; a memory 202 storing an application 208; a volume adjustment circuit 210; and a communication interface 216. In general, the controller 200 is communicatively coupled to the radio transceiver 201, the memory 202, the volume adjustment circuit 210, the interface 216 and the switch 128. As will be explained in further detail below, the volume adjustment circuit 210 is configured to control the volume level of the speaker 161 between a plurality of discrete volume levels.

While not depicted, in some embodiments, the device 100 includes a battery that includes, but is not limited to, a rechargeable battery, a power pack, and/or a rechargeable power pack. However, in other embodiments, the device 100 is incorporated into a vehicle and/or a system that includes a battery and/or power source, and the like, and power for the device 100 is provided by the battery and/or power system of the vehicle and/or system; in other words, in such embodiments, the device 100 need not include an internal battery.

In yet further embodiments, the device 100 includes additional or alternative components related to, for example, telephony, messaging, entertainment, and/or any other components that may be used with a communication device.

Hence, in some embodiments, the device 100 comprises a mobile device which includes, but is not limited to, any suitable combination of electronic devices, communication devices, computing devices, portable electronic devices, mobile computing devices, portable computing devices, tablet computing devices, telephones, PDAs (personal digital assistants), cellphones, smartphones, e-readers, mobile camera devices and the like. Other suitable devices are within the scope of present embodiments.

In some embodiments, the device 100 is specifically adapted for emergency service radio functionality, and the like, used by emergency responders and/or first responders, including, but not limited to, police service responders, fire service responders, emergency medical service responders, and the like. In some of these embodiments, the device 100 further includes other types of hardware for emergency service radio functionality, including, but not limited to, push-to-talk ("PTT") functionality; for example, in some embodiments, the radio transceiver 201 is adapted for push-to-talk functionality and the device 100 operates in a push-to-talk mode, transmitting audio from the microphone 160 to the device 100 for transmission by the radio transceiver 201 when the input device 178 is actuated (e.g. the microphone mode and the speaker mode occur using push-to-talk functionality). However, other devices are within the scope of present embodiments.

In particular, the radio transceiver 201 is generally configured to wirelessly communicate using one or more communication channels, the radio transceiver 201 being implemented by, for example, one or more radios and/or connectors and/or network adaptors, configured to communicate wirelessly, using the antenna 126, with network architecture that is used to implement one or more communication channels between other devices and/or a wireless network. The radio transceiver 201 can include, but is not limited to, one or more broadband and/or narrowband transceivers, such as a Long Term Evolution (LTE) transceiver, a Third Generation (3G) (3GGP or 3GGP2) transceiver, an Association of Public Safety Communication Officials (APCO) Project 25 (P25) transceiver, a Digital Mobile Radio (DMR) transceiver, a Terrestrial Trunked Radio (TETRA) transceiver, a WiMAX transceiver operating in accordance with an IEEE 902.16 standard, and/or other similar type of wireless transceiver configurable to communicate via a wireless network for infrastructure communications. In yet further embodiments, the radio transceiver 201 includes one or more local area network or personal area network transceivers operating in accordance with an IEEE 902.11 standard (e.g., 902.11a, 902.11b, 902.11g), or a Bluetooth transceiver. In some embodiments, the radio transceiver 201 is further configured to communicate "radio-to-radio" on some communication channels, while other communication channels are configured to use wireless network infrastructure.

Example communication channels over which the radio transceiver 201 is generally configured to wirelessly communicate include, but are not limited to, one or more of wireless channels, cell-phone channels, cellular network channels, packet-based channels, analog network channels, Voice-Over-Internet ("VoIP"), push-to-talk channels and the like, and/or a combination.

The controller 200 of FIG. 2 includes one or more logic circuits configured for volume level control of the speaker 161 at the remote speaker microphone 150. Example logic circuits include one or more processors, one or more microprocessors, one or more ASIC (application-specific integrated circuits) and one or more FPGA (field-programmable gate arrays). In some embodiments, the controller 200 and/or the device 100 is not a generic controller and/or a generic communication device, but a communication device specifically configured to implement volume level control functionality of the speaker 161 at the remote speaker microphone 150. For example, in some embodiments, the device 100 and/or the controller 200 specifically comprises a computer executable engine configured to implement specific volume level control functionality.

The memory 202 of FIG. 2 is a machine readable medium that stores machine readable instructions to implement one or more programs or applications. Example machine readable media include a non-volatile storage unit (e.g. Erasable Electronic Programmable Read Only Memory ("EEPROM"), Flash Memory) and/or a volatile storage unit (e.g. random access memory ("RAM")). In the embodiment of FIG. 2, programming instructions (e.g., machine readable instructions) that implement the functional teachings of the device 100 as described herein are maintained, persistently, at the memory 202 and used by the controller 200 which makes appropriate utilization of volatile storage during the execution of such programming instructions.

In particular, the memory 202 of FIG. 2 stores instructions corresponding to an application 208 that, when executed by the controller 200, enables the controller 200 to implement volume level control functionality associated with the application 208. In the illustrated example, when the controller 200 executes the application 208, the controller 200 is enabled to: control audio output to the speaker 161 of the remote speaker microphone 150 between one of a plurality of discrete volume levels using, for example, the volume adjustment circuit 210. As such, the volume adjustment circuit 210 comprises any circuit configured to attenuate audio between a plurality of discrete volume levels.

Furthermore, in some embodiments, when the controller 200 executes the application 208, the controller 200 is enabled to: in response to receiving touch input at the touch sensor 163, control a volume level of the speaker 161 (e.g. using the volume adjustment circuit 210) from a first volume level to a lower volume level, the first volume level being one of the plurality of discrete volume levels.

However, in other embodiments, such controlling of the volume level of the speaker 161 from a first volume level to a lower volume level, when touch input is received at the touch sensor 163, occurs at the remote speaker microphone 150.

Hence, with continued reference to FIG. 2, the remote speaker microphone 150 further comprises: an optional volume adjustment circuit 220 configured to control a volume level of the speaker 161 from a first volume level to a lower volume level, the first volume level being one of a plurality of discrete volume levels; and a communication interface 226. In particular, when the volume adjustment circuit 220 is present, the volume adjustment circuit 220 is in communication with the touch sensor 163, the speaker 161 and, when present, the visual indicator 165. In these embodiments, the volume adjustment circuit 220 is configured to: perform volume adjustment of the speaker 161 in response to the touch sensor 163 receiving the touch input; and, optionally, control the indicator 165 to provide a status of the volume level of the speaker 161. As the volume adjustment circuit 220 is optional at the remote speaker microphone 150, the volume adjustment circuit 220 is depicted in broken lines. When the volume adjustment circuit 220 is not present at the remote speaker microphone 150, the touch sensor 163, the speaker 161 and, when present, the visual indicator 165 are in communication with the controller 200 and/or the volume adjustment circuit 210 via the interfaces 226, 216.

In other words, the control of the speaker 161 upon receipt of touch input at the touch sensor 163 may occur using the volume adjustment circuit 220, when present at the remote speaker microphone 150, and/or the controller 200 and the volume adjustment circuit 210 at the device 100. Indeed, the control of the speaker 161 can be distributed between the volume adjustment circuit 220, when present at the remote speaker microphone 150, and the controller 200 and the volume adjustment circuit 210 at the device 100

While not depicted, in some embodiments, for example when the remote speaker microphone 150 is wireless, the remote speaker microphone 150 includes a battery that includes, but is not limited to, a rechargeable battery, a power pack, and/or a rechargeable power pack. However, in other embodiments, the remote speaker microphone 150 is powered by the device 100, for example via the cable 151.

In general, the interfaces 216, 226 are configured to communicate with each other, for example, to convey audio therebetween via a link 251, which may be wired or wireless as desired. For example, when the device 100 and the remote speaker microphone 150 are in communication via the cable 151, the cable 151 (and the connector 180) comprises the link 251, and the link 251 is wired; in these embodiments, the cable 151 and/or link 251 may also provide power to the remote speaker microphone 150. However, in other embodiments, each of the interfaces 216, 226 comprises a wireless interface, including, but not limited to a Bluetooth™ interface, and the link 251 is wireless. In these embodiments, the remote speaker microphone 150 includes a respective battery, and the like.

Either way, the interfaces 216, 226 convey audio between the device 100 and the remote speaker microphone 150, including audio from the radio transceiver 201 to the speaker 161, and audio from the microphone 160 to the antenna 126 depending, for example, on whether the input device 178 has been actuated to place the remote speaker microphone 150 into the speaker mode or the microphone mode. Indeed, as depicted, the input device 178 is in communication with the interface 226 and can either control the interface between a receive or transmit mode (corresponding, respectively, to the speaker mode and the microphone mode), or the interface 226 conveys data indicative of the actuation of the input device 178 to the controller 200 which controls the interfaces 216, 226 accordingly.

Similarly, when present, the switch 168 is in communication with the interface 226 and the interface 226 conveys data indicative of an actuation of the switch 168 to the controller 200 via the interface 216, which controls the volume of audio being transmitted to the speaker 161 accordingly. For example, as depicted, the switch 168 comprises a rotary switch which, when rotated, causes controller 200 to control the volume level of the speaker 161 to one of a plurality of discrete volume levels, the volume level becoming louder when the rotary switch is rotated in one direction and the volume level becoming softer when the rotary switch is rotated in the other direction. Alternatively, the switch 168 comprises a rocker switch or a toggle switch.

The switch 128 at the device 100 operates in a similar manner to the switch 168. Indeed, as depicted, the switch 128 comprises a rotary switch, however the switch 128 can include, but is not limited to, one of a rotary switch, a rocker switch, a toggle switch and the like. When the switch 128 comprises a rotary switch, the rotary switch is one of a continuous rotation type (e.g. a rotary switch that is continuously rotatable in either direction without stops) or a type without continuous rotation, having stops (e.g. mechanical stops), for example a stop corresponding to a highest volume level and a stop corresponding to a lowest volume level; furthermore, when the switch 128 comprises a rotary switch of a type without continuous rotation, having stops, each of the plurality of discrete volume levels is encoded to a particular angular position of the rotary switch.

Hence, the volume level of the speaker 161 is controllable from either the device 100 and/or the remote speaker microphone 150 (assuming the switch 168 is present at the remote speaker microphone 150).

In any event, in certain situations, it can be challenging for a user of the device 100 and the remote speaker microphone 150 to operate the switches 128, 168 to control a volume level of the speaker 161. For example, in emergency situations, it can be challenging for a user of the device 100 and the remote speaker microphone 150 to locate and/or operate the switches 128, 168. Indeed, in some of these situations, the user of the device 100 and the remote speaker microphone 150 may have an urgent need to quickly mute the speaker 161 which may be challenging when the user cannot quickly locate and/or operate the switches 128, 168.

Hence, the remote speaker microphone 150 is provided with the touch sensor 163 which, in response to receiving touch input, controls a volume level of the speaker 161 from a first volume level to a lower volume level, the first volume level being one of a plurality of discrete volume levels. Such control can occur either via the volume adjustment circuit 220 at the remote speaker microphone 150, or the volume adjustment circuit 210 at the device 100.

Indeed, when such control occurs at the volume adjustment circuit 220 at the remote speaker microphone 150, the volume adjustment circuit 220 receives an indication of touch input being received at the touch sensor 163 and controls the audio to the speaker 161 to a lower volume level. In some of these embodiments, the volume adjustment circuit 220 comprises a latch circuit, and the like, which controls signals to the speaker 161 between a current volume level (e.g. as received from the device 100) to a lower given volume level (and optionally controls the indicator 165 to provide a status of the volume level of the speaker 161; for example, the indicator 165 may be turned on when the speaker 161 is controlled to the lower given volume level and otherwise turned off).

Alternatively, for example, when the volume adjustment circuit 220 is not present at the remote speaker microphone 150, such control occurs using the volume adjustment circuit 210 at the device 100. For example, data indicative of the touch sensor 163 receiving touch input is conveyed to the controller 200 via interfaces 226, 216, and the controller 200 responsively controls the volume level of the speaker 161 by controlling the volume level of audio output to the remote speaker microphone 150 using the volume adjustment circuit 210. Indeed, in depicted embodiments, the memory 202 stores a first ordered list 301 of pre-determined volume levels and a volume level 305 to which the speaker 161 is controlled when the touch input is received at the touch sensor 163.

Figure 3:
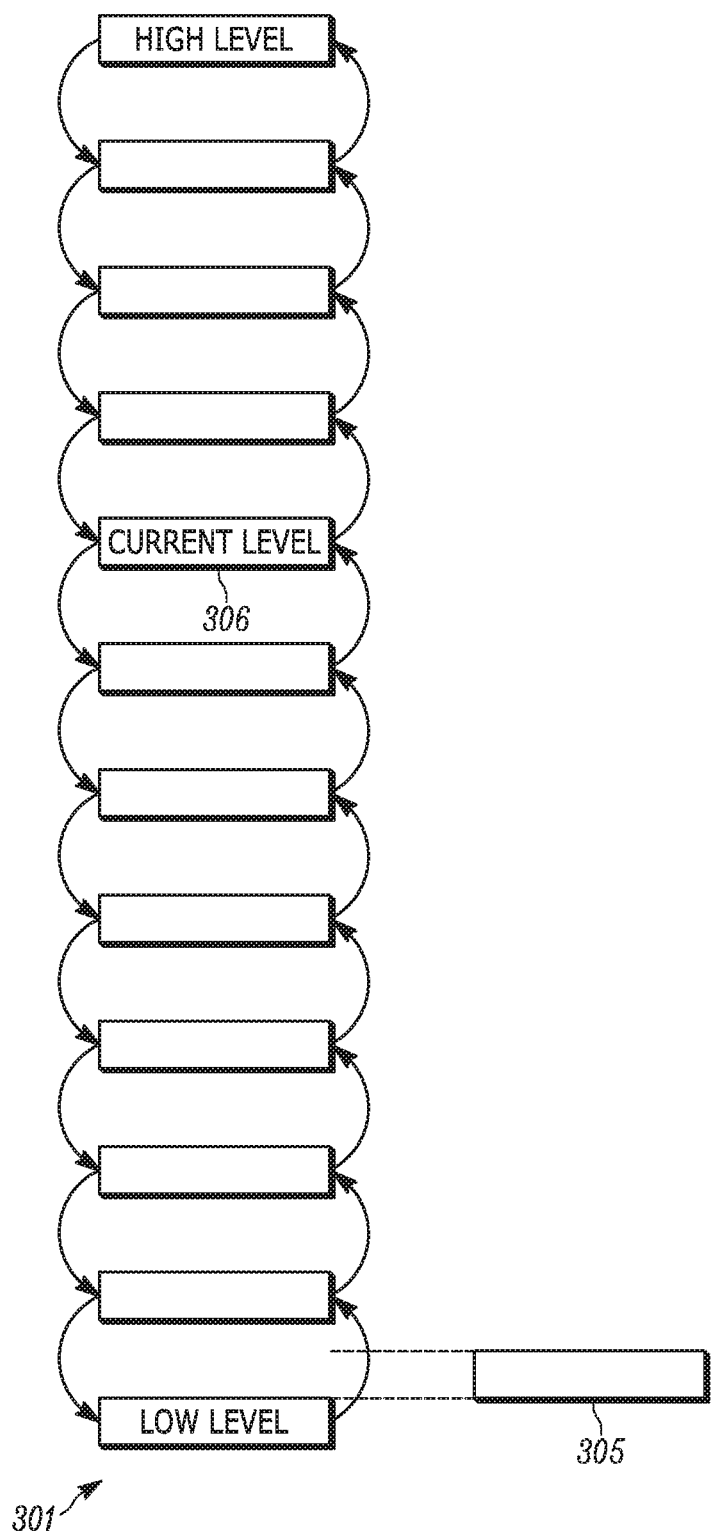
FIG. 3 depicts an ordered list of pre-determined volume levels to which the speaker of the remote speaker microphone of FIG. 1 is controlled, and a muted volume level, in accordance with some embodiments.

Attention is next directed to FIG. 3 which schematically depicts the first ordered list 301 of pre-determined volume levels, each item in the list 301 corresponding to one of the plurality of discrete volume levels to which the speaker 161 is controlled using the switches 128, 168. Furthermore, while each item in the list 301 is depicted as a box and/or a range of settings, such a depiction is merely for convenience, and each item in the list 301 is understood to correspond to a discrete volume level to which the speaker 161 is controlled.

The list 301 comprises a high volume level (a highest volume level to which the speaker 161 is controlled), a low volume level (a lowest volume level to which the speaker 161 is controlled), and, as depicted, at least one volume level therebetween. However, while twelve volume levels are depicted in the list 301, the list 301 can comprise any number of volume levels, for example 256 volume levels. Indeed, the number of volume levels may depend on whether the switch 128 and/or the switch 168 is a rotary switch or a rocker switch and the like; for example, when the switch 128 and/or the switch 168 is a rotary switch, the number of volume levels may be 256, while, when the switch 128 and/or the switch 168 is a rocker switch, and the like, the number of volume levels may be between 10 and 20 volume levels.

Indeed, the volume level is generally controlled between successive and/or adjacent volume levels in the list 301 (e.g. as indicated by the arrows on either side of the list 301, with the down arrows indicating a volume level adjustment from a higher volume level to the next lower volume level, and the up arrows indicating a volume level adjustment from a lower volume level to the next higher volume level). As depicted, the volume level has been selected, using actuation of the switch 128 and/or the switch 168, to be a current volume level 306 between the high volume level and the low volume level. However, the current volume level 306 can alternatively be one of the high volume level and the low volume level. For example, when the switch 128 and/or the switch 168 comprises a rocker switch a volume level adjustment occurs between adjacent volume levels each time the rocker switch is actuated according to an upward volume level actuation or a downward volume level actuation. Similarly, when the switch 128 and/or the switch 168 comprises a rotary switch, a volume level adjustment occurs between adjacent volume levels each time the rotary switch is turned through a given angle in one direction (e.g. an upward volume level direction) or opposite direction (e.g. a downward volume level direction). When the rotary switch comprises a continuous rotation type, once the volume level is at the highest volume level or the lowest volume level, further turning on the rotary switch to respectively increase or decrease volume has no further effect on the volume level. When the rotary switch comprises a type without continuous rotation, having stops, each of the volume levels in the list 301 is encoded to an angular position between the stops.

In general, the controller 200 receives an indication of an actuation of the switch 128 and/or the switch 168, and controls the volume adjustment circuit 210 (or the volume adjustment circuit 220) accordingly.

In some embodiments, as depicted, the list 301 is generally stored in the memory 202, for example as a module, and the like, of the application 208; in these embodiments, controller 200 outputs data indicative of the current volume level 306 to the volume adjustment circuit 210 which adjusts the volume level of audio being output to the speaker 161 via the interfaces 216, 226 accordingly.

In other embodiments, the list 301 is hardwired into the volume adjustment circuit 210 (or the volume adjustment circuit 220) and the controller 200 outputs data indicative of the volume level being raised or lowered to the volume adjustment circuit 210 which adjusts the volume level of audio being output to the speaker 161 via the interfaces 216, 226 to next higher volume level or the next lower level accordingly.

FIG. 3 also depicts a volume level 305 to which the speaker 161 is controlled when the touch input is received at the touch sensor 163. While the volume level 305 does not correspond to one of the plurality of volume levels in the list 301 (as indicated by the broken lines between the volume level 305 and the volume levels in the list 301), in other embodiments, the volume level 305 corresponds to one of the plurality of volume levels in the list 301. Put another way, the lower volume level 305, to which the speaker 161 is controlled when touch input is received at the touch sensor 163, comprises: one of the plurality of discrete volume levels (e.g. of the list 301); or an alternate volume level different from the plurality of discrete volume levels. Either way, the volume level 305 is lower than the current volume level 306.

If the current volume level 306, however, is less than the volume level 305, when the touch input is received at the touch sensor 163, the current volume level 306 may, in some embodiments remain the same, as determined, for example, by the controller 200.

Indeed, in some embodiments the volume level 305 is a completely off state. In other embodiments, the volume level 305 is at a whisper volume level, wherein a user of the remote speaker microphone 150 can hear audio from the speaker 161 at the whisper volume level only when their ear is adjacent the speaker 161.

Indeed, the volume level 305 can be configurable by a user of the device 100 and the remote speaker microphone 150; such embodiments may be useful to emergency workers who may be using the remote speaker microphone 150 in emergency situations, where hearing audio from the speaker 161 is important, but it is also important that the audio not be heard by others in the vicinity of the user; a non-limiting example of such a situation is a police officer in a stakeout. For example, in some embodiments, the volume level 305 is configurable at the device 100 using an input device such as a touch display, a keyboard, and the like, which can be a component of the device 100 and/or temporarily in communication with the device 100, for example when the device 100 is in a provisioning mode and the like.

In other embodiments, the remote speaker microphone 150 comprises a memory (not depicted) which stores the volume level 305 configured by the user as received from the device 100 and/or using a touch display, a keyboard, and the like, temporarily in communication with the remote speaker microphone 150, for example when the device 100 is in a provisioning mode and the like. In these embodiments, when the remote speaker microphone 150 is connected to the device 100, the remote speaker microphone 150 conveys the volume level 305 to the device 100 which stores the volume level 305 in the memory 202. In this manner, a user can be provisioned with the remote speaker microphone 150, configure the remote speaker microphone 150 according to the desired volume level 305, and the device 100 is configured to operate using the desired volume level 305 when the remote speaker microphone 150 connects to the device 100. Indeed, when a second remote speaker microphone (similar to the remote speaker microphone 150) later connects with the device 100, the device 100 then operates according to the desired volume level received from the second remote speaker microphone.

Figure 4:
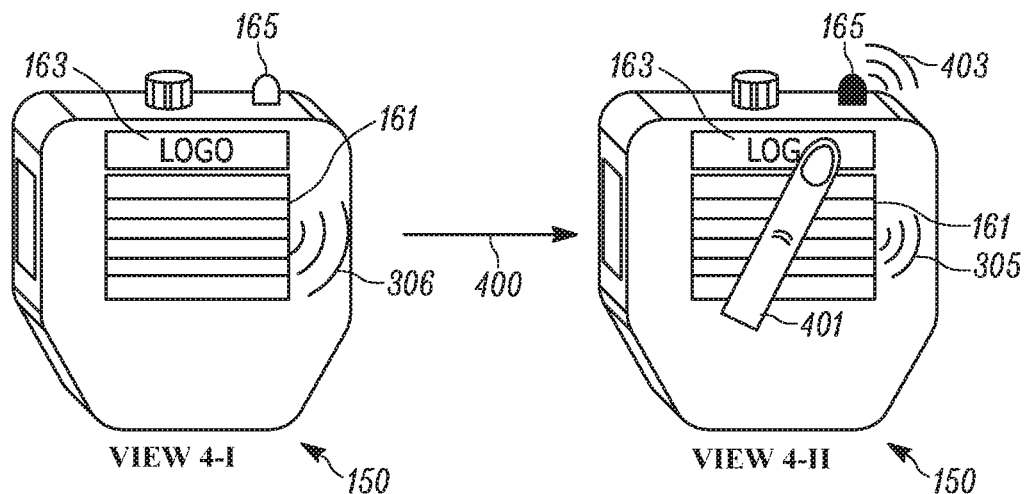
FIG. 4 depicts a remote speaker microphone with touch volume control in use in accordance with some embodiments.

Attention is next directed to FIG. 4 which depicts operation of the remote speaker microphone 150 and in particular a sequence of views 4-I, 4-II of the remote speaker microphone 150. The second view 4-II occurs after the first view 4-I as indicated by the arrow 400 therebetween.

While not depicted, it is assumed that the remote speaker microphone 150 is in communication with the device 100 and receiving audio therefrom, as described above. In particular, FIG. 4 depicts a first view 4-I of the remote speaker microphone 150 operating in a speaker mode with audio being emitted from the speaker at the current volume level 306. As depicted, the visual indicator 165 is off, indicating that the speaker 161 has not been muted and/or not controlled to the lower volume level 305. The remote speaker microphone 150 may be referred to as being in an unmuted state when the speaker 161 has not been controlled to the lower volume level 305.

In the second view 4-II, touch input is received at the touch sensor 163, as depicted when a finger 401, and the like, touches the touch sensor 163. In response, the speaker 161 is controlled to the lower volume level 305. The remote speaker microphone 150 may be referred to as being in a muted state when the speaker 161 is controlled to the lower volume level 305.

Furthermore, in the depicted embodiment, the visual indicator 165 is turned on and emits light 403 to indicate that the speaker 161 has been muted and/or controlled to the lower volume level 305. Hence, the visual indicator 165 provides a status of the volume level of the speaker 161 and/or a volume state of the remote speaker microphone 150.

In some embodiments, the remote speaker microphone 150 remains in the muted state only while the touch input is being received at the touch sensor 163; in other words, in these embodiments, when the finger 401, and the like, is removed from the touch sensor 163, operation of the remote speaker microphone 150 returns to the state depicted in the view 4-I.

Put another way, in the embodiment depicted by the views 4-I, 4-II, the touch sensor 163 is further configured to control the volume level of the speaker 161 to the lower volume level 305 only while the touch input is being received at the touch sensor 163, the speaker 161 returning to the first volume level (e.g. volume level 306) when the touch input is no longer being received at the touch sensor 163.

However, in other embodiments, the remote speaker microphone 150 remains in the muted state after the touch input is no longer being received at the touch sensor 163, until further touch input is received at the touch sensor 163.

Figure 5:
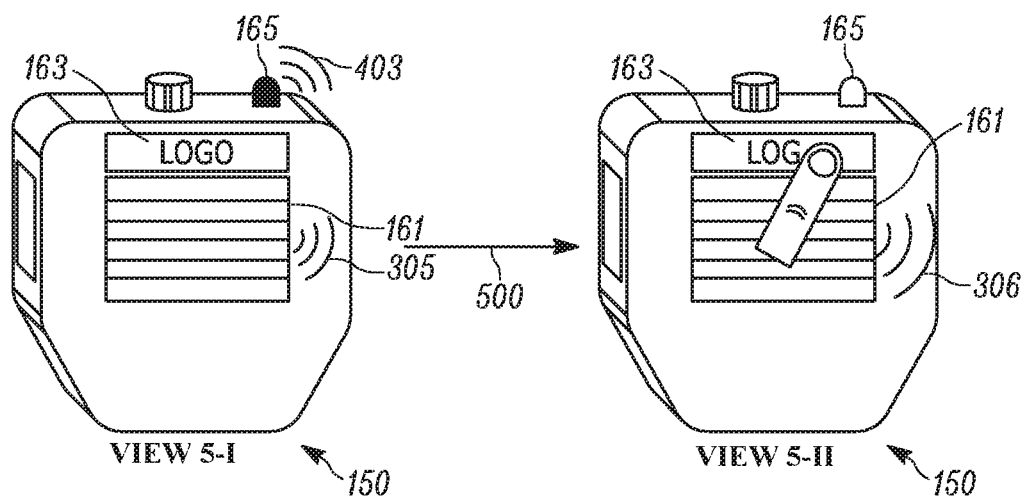
FIG. 5 depicts a remote speaker microphone with touch volume control in use in accordance with some embodiments.

For example, attention is next directed to FIG. 5 which depicts operation of the remote speaker microphone 150 and in particular a sequence of views 5-I, 5-II of the remote speaker microphone 150. The second view 5-II occurs after the first view 5-I as indicated by the arrow 500 therebetween.

The first view 5-I is similar to the second view 4-II, however, the finger 401 has been removed from the touch sensor 163, the remote speaker microphone 150 remaining in the muted state with the volume level of the speaker 161 remaining at the lower volume level 305, and the visual indicator continuing to emit the light 403.

In the second view 5-II, touch input is again received at the touch sensor 163, as depicted when the finger 401, and the like, again touches the touch sensor 163. In response, the speaker 161 is controlled to the first volume level 306, returning the remote speaker microphone 150 to the unmuted state, and the visual indicator 165 is turned off.

Put another way, in the embodiment depicted by the views 5-I, 5-II, the touch sensor 163 is further configured to: maintain the volume level of the speaker 161 at the lower volume level 305 after the touch input is no longer being received at the touch sensor 163; and, thereafter control the volume level of the speaker 161 back to the first volume level 306 when second touch input is received at the touch sensor 163.

Hence, in the embodiments depicted in FIG. 5, the touch sensor 163 is tapped a first time to mute the speaker 161, and then tapped a second time to unmute the speaker 161.

The operation of the remote speaker microphone 150 in this manner is described in more detail below with reference to FIG. 8.

Figure 6:
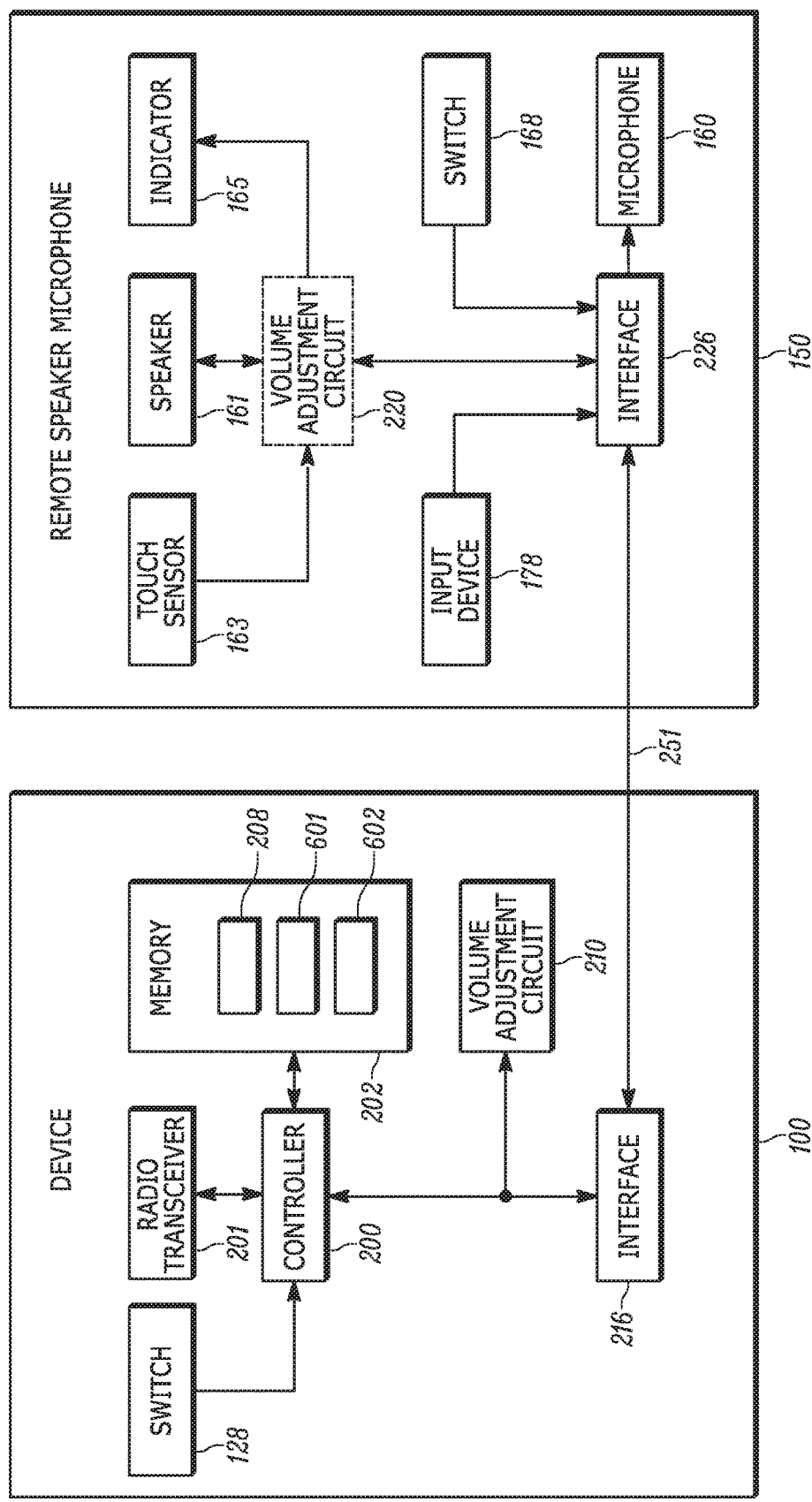
FIG. 6 is a schematic view of the device of FIG. 1 in accordance with some alternative embodiments.

In the foregoing specification, specific embodiments have been described. However, one of ordinary skill in the art appreciates that various modifications and changes can be made. For example, attention is next directed to FIG. 6 which is substantially similar to FIG. 2, with like elements having like numbers. However, in contrast to FIG. 2, in FIG. 6, the memory 202 stores a first ordered list 601 of pre-determined volume levels, similar to the list 301, and a second ordered list 602 of pre-determined volume levels different from the first ordered list 601 of pre-determined volume levels.

Figure 7:
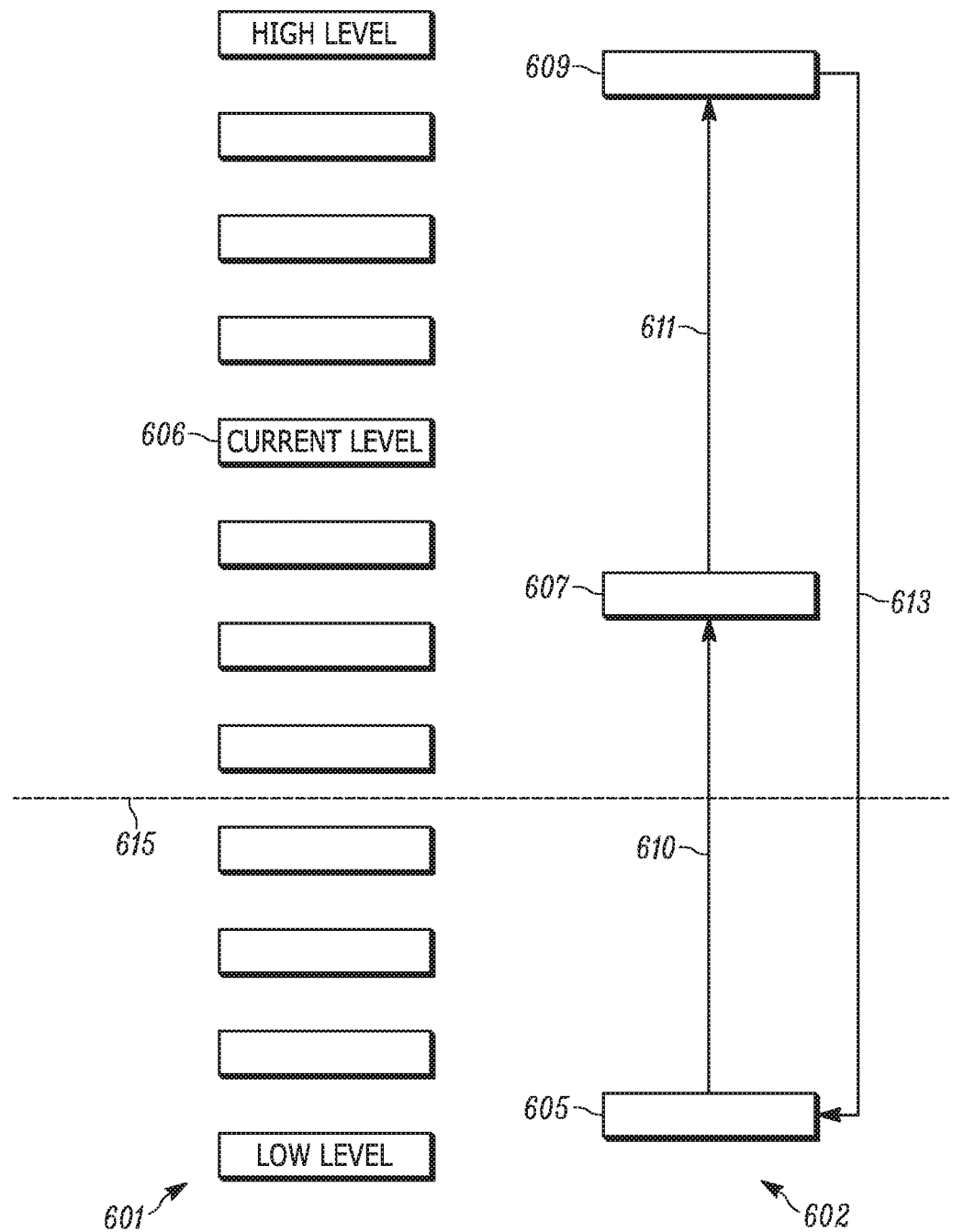
FIG. 7 depicts a first ordered list of pre-determined volume levels to which the speaker of the remote speaker microphone of FIG. 1 is controlled using a switch, and a second ordered list of pre-determined volume levels to which the speaker of the remote speaker microphone of FIG. 1 is controlled using a touch sensor, in accordance with some embodiments.

For example, attention is next directed to FIG. 7 which depicts the first ordered list 601 of pre-determined volume levels, similar to the list 301, and the second ordered list 602 of pre-determined volume levels different from the first ordered list 601 of pre-determined volume levels. In particular, the list 601 represents the volume levels to which the speaker 161 is controlled when the switch 128 and/or the switch 168 is actuated. As depicted, a current volume level 606 has been selected from the list 601 and the speaker 161 has been controlled to the current volume level 606.

Furthermore, the list 602 comprises three volume levels: a lower volume level 605 (similar to the volume level 305), a mid-range volume level 607, and a high volume level 609 (e.g. the mid-range volume level 607 is between the lower volume level 605 and the high volume level 609). As depicted, a position of each of the volume levels 605, 607, 609 in the list 602 represents a volume level to which the speaker 161 can be controlled using the touch sensor 163, relative to the volume levels of the list 601.

While three volume levels 605, 607, 609 are depicted, the list 602 can comprise other numbers of volume levels, including, but not limited to, at least two volume levels, one of which is the volume level 605.

Furthermore, the volume levels 605, 607, 609 of the list 602 can be one or more of different in number and different in spacing from the volume levels of the list 601, and furthermore, the high and low volume levels on each of the lists 601, 602 can be different (e.g. different in range). However, in some embodiments, the number of volume levels of the list 602 is smaller than the number of volume levels of the list 601 (e.g. the list 602 includes fewer discrete volume levels than the list 601).

Furthermore, the volume levels 605, 607, 609 of the list 602 may be configurable, the user of the device 100 and/or the remote speaker microphone 150 configuring, for example, a high volume level 609, a mute (and/or whisper) volume level 605, and the mid-range volume level 607.

In any event, in these embodiments, the controller 200 determines that the touch sensor 163 was last used to select a volume level (e.g. the volume level 605), the volume level 605 being maintained when the touch input is no longer detected at the touch sensor 163, as in view 5-I. Furthermore, in these embodiments, the touch sensor 163 is further configured to, in response to receiving further touch input, select the volume level of the speaker 161 from among the second ordered list 602 of pre-determined volume levels.

In other words, once the touch sensor 163 is tapped a first time, the speaker 161 is muted to the volume level 605. However, when the touch sensor 163 is tapped a second time, the speaker 161 is controlled to the next higher volume level 607 in the list 602, as represented by the arrow 610; similarly, when the touch sensor 163 is tapped a third time, the speaker 161 is controlled to the next higher volume level 609 in the list 602, as represented by the arrow 611. If there are more than three volume levels in the list 602, the volume level of the speaker 161 increases to a next higher volume level at each successive tap. However, when the speaker 161 has reached highest volume 609 in the list 602, the next tap causes the volume level of speaker 161 to be controlled from the highest volume 609 in the list 602 to the lowest volume 605 in the list 602, as represented by the arrow 613.

The control of the touch sensor 163 between volume levels 605, 607, 609 using taps occurs only when the switch 128 and/or the switch 168 is not used to control the volume level of the speaker 161 between taps. Otherwise, when the switch 128 and/or the switch 168 is last used to control the volume level of the speaker 161, the next tap at the touch sensor 163 causes the speaker 161 to be controlled to the lowest volume level 605.

In some of these embodiments, however, when the mechanically actuated switch 128 and/or 168 was last used to select the volume level of the speaker 161, the touch sensor 163 is configured to control the volume level of the speaker 161 from a current volume level 606 to the lower volume level 605 when touch input is received at the touch sensor 163, only when the first volume level 606 is above a threshold volume level 615, which can be configurable at the device 100 and/or the remote speaker microphone 150.

Hence, when a current volume level of the speaker 161, as selected by the switch 128 and/or the switch 168 is below the threshold volume level 615, and touch input is received at the touch sensor 163 either: nothing occurs (e.g. the speaker 161 remains at the volume level of the list 601 that is below the threshold volume level 615); or the touch input received at the touch sensor 163 causes the speaker 161 to be controlled to the mid-range volume level 607 and/or a volume level of the list 602 that is higher than the current volume level.

In some implementations, when the touch sensor 163 was last used to select the volume level of the speaker 161 (e.g. from the list 602), and the switch 128 and/or the switch 168 is next used to select a volume level from the list 601, the selection of the volume level from the first list 601 depends on a type of the switch 128 and/or the switch 168. For example, when the switch 128 and/or the switch 168 comprises a rocker switch, or a continuous rotation type rotary switch, and that switch is actuated to change the volume level after the touch sensor 163 was last used to change the volume level, the switch will increment or decrement volume level in the first list 601 starting from a volume level in the first list 601 that is closest to the last selected volume level in the second list 602. Hence, a "smooth" transition occurs between a current volume level selected from the second list 602 to selecting a volume level from the first list 601.

However, when the switch 128 and/or the switch 168 comprises a type without continuous rotation, having stops, with the volume levels of the first list 601 encoded to an angular position, and that switch is actuated to change the volume level after the touch sensor 163 was last used to change the volume level, the switch will increment or decrement volume level in the first list 601 starting from the volume level corresponding to the current angular position of the switch. Hence, a "step" transition occurs between a current volume level selected from the second list 602 to selecting a volume level from the first list 601 as starting from a volume level corresponding to a current angular position of the switch 128 and/or the switch 168. For example, when the touch sensor 163 has been used to adjust the volume level to the lowest volume level 605, and the switch 128 and/or the switch 168 (e.g. a rotary switch of a type without continuous rotation, having stops) is next actuated, and the angular position of the switch 128 and/or the switch 168 corresponds to a the highest volume level in the first list 601, the volume level of the speaker 161 jumps from the lowest volume level 605 in the second list 602 to the highest volume level in the second list 602.

The operation of the remote speaker microphone 150 in this manner is described in more detail below with reference to FIG. 9.

Figure 8:
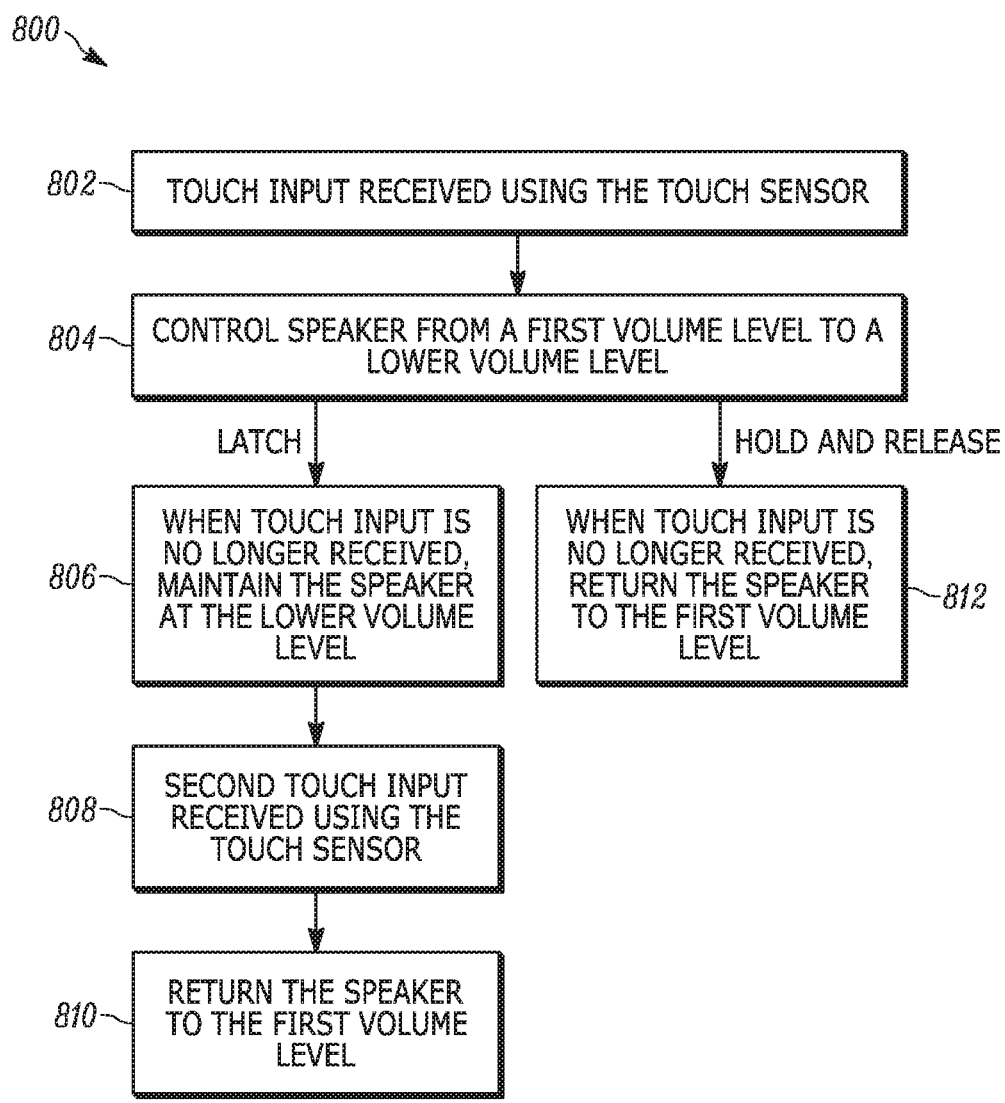
FIG. 8 is a flowchart of a method of touch volume control of a remote speaker microphone in accordance with some embodiments.

Attention is now directed to FIG. 8 which depicts a flowchart representative of a method 800 for volume level control of the speaker 161 at the remote speaker microphone 150. In some embodiments, the operations of the method 800 of FIG. 8 correspond to machine readable instructions that are executed by, for example, the device 100 of FIG. 2, and specifically by the controller 200 of the device 100. In the illustrated example, the instructions represented by the blocks of FIG. 8 are stored at the memory 202, for example, as the application 208. The method 800 of FIG. 8 is one way in which the controller 200 and/or the device 100 is configured. Furthermore, the following discussion of the method 800 of FIG. 8 will lead to a further understanding of the device 100, and its various components.

However, it is to be understood that the device 100 and/or the method 800 may be varied, and need not work exactly as discussed herein in conjunction with each other, and that such variations are within the scope of present embodiments. For example, in other embodiments, the method 800 is performed by the volume adjustment circuit 220 of the remote speaker microphone 150.

The method 800 of FIG. 8 need not be performed in the exact sequence as shown and likewise various blocks may be performed in parallel rather than in sequence. Accordingly, the elements of method 800 are referred to herein as "blocks" rather than "steps." The method 800 of FIG. 8 may be implemented on variations of the device 100 of FIG. 2, as well.

It is further assumed in the method 800 that the speaker 161 is initially providing audio at a first volume level, similar to the current volume level 306 of FIG. 3 (e.g. a volume level selected from the list 301), and/or that the remote speaker microphone 150 is in the unmuted state of the view 4-1.

At the block 802, touch input is received using the touch sensor 163. In some embodiments, an indication of the touch input is conveyed to the controller 200 using interfaces 216, 226.

At the block 804, the speaker 161 is controlled from the first volume level to a lower volume level by one or more of the controller 200, the volume adjustment circuit 210, and the volume adjustment circuit 220. In other words, the remote speaker microphone 150 enters the muted state of the views 4-II, 5-I.

The method 800 then depends on a mode of the device 100 and/or the remote speaker microphone 150. For example, in a latch mode, at the block 806, when the touch input is no longer being received, the speaker 161 is maintained at the lower volume level and/or the remote speaker microphone 150 remains in the muted state of the views 4-II, 5-I. At the block 808, second touch input is received using the touch sensor 163 and, in response, at the block 810, the speaker 161 is returned to the first volume level. In other words, the remote speaker microphone 150 enters the unmuted state of the views 4-1, 5-I-II. The blocks 806, 808, 810 are performed by one or more of the controller 200, the volume adjustment circuit 210, and the volume adjustment circuit 220.

However, returning to the block 804, after the speaker 161 is controlled from the first volume level to a lower volume level, in a hold and release mode, at the block 812, when the touch input is no longer being received, the speaker 161 is returned to the first volume level and/or the remote speaker microphone 150 enters the unmuted state of the views 4-I, 5-II. The block 812 is performed by one or more of the controller 200, the volume adjustment circuit 210, and the volume adjustment circuit 220.

Whether the device 100 and/or the remote speaker microphone 150 is controlled according to the latch mode (e.g. of the blocks 806, 808, 810) or the hold and release mode (e.g. of the block 812) can be configured at the device 100, for example in a provisioning step. In other words, in some embodiments, whether the device 100 and/or the remote speaker microphone 150 is controlled according to the latch mode or the hold and release mode may be provisioned by a user of the device 100 and/or the remote speaker microphone 150. Alternatively, the device 100 and/or the remote speaker microphone 150 is provisioned to operate according to the latch mode or the hold and release mode at a factory and the like, and/or according to a given specification.

Figure 9:
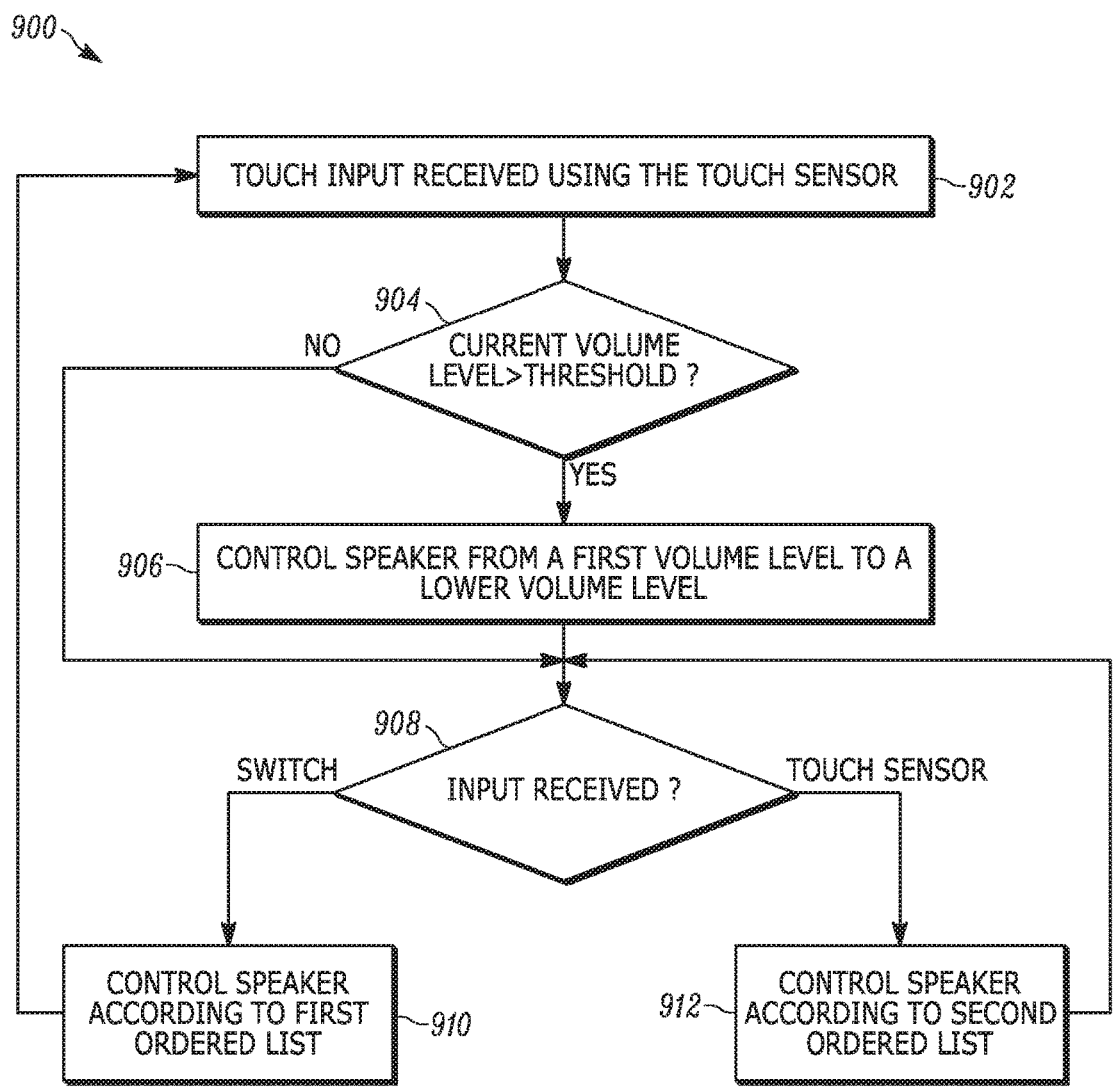
FIG. 9 is a flowchart of a method of touch volume control of a remote speaker microphone in accordance with some embodiments.

Attention is now directed to FIG. 9 which depicts a flowchart representative of a method 900 for volume level control of the speaker 161 at the remote speaker microphone 150. In some embodiments, the operations of the method 900 of FIG. 9 correspond to machine readable instructions that are executed by, for example, the device 100 of FIG. 2, and specifically by the controller 200 of the device 100. In the illustrated example, the instructions represented by the blocks of FIG. 9 are stored at the memory 202, for example, as the application 208. The method 900 of FIG. 9 is one way in which the controller 200 and/or the device 100 is configured. Furthermore, the following discussion of the method 900 of FIG. 9 will lead to a further understanding of the device 100, and its various components. However, it is to be understood that the device 100 and/or the method 900 may be varied, and need not work exactly as discussed herein in conjunction with each other, and that such variations are within the scope of present embodiments.

The method 900 of FIG. 9 need not be performed in the exact sequence as shown and likewise various blocks may be performed in parallel rather than in sequence. Accordingly, the elements of method 900 are referred to herein as "blocks" rather than "steps." The method 900 of FIG. 9 may be implemented on variations of the device 100 of FIG. 2, as well.

It is further assumed in the method 900 that device 100 has been provisioned with the first ordered list 601 and the second ordered list 602, and that the speaker 161 is initially providing audio at a first volume level, similar to the current volume level 605 of FIG. 7 (e.g. a volume level selected from the list 301), and/or that the remote speaker microphone 150 is in the unmuted state, similar to that depicted in the view 4-1.

At the block 902, the controller 200 receives an indication of touch input received using the touch sensor 163.

At the block 904, the controller 200 determines whether the current volume level of the speaker 161 is greater than a threshold volume level, for example the threshold volume level 615.

When the current volume level of the speaker 161 is not greater than a threshold volume level (e.g. a "NO" decision at the block 904), the controller 200 controls the speaker 161 at the blocks 908, 910, 912 depending on whether input is received at the touch sensor 163 or the switches 128, 168. For example, when the touch input is received at the block 902, and the current volume level of the speaker 161 is not greater than a threshold volume level, the controller 200 controls the speaker 161 according to the second ordered list 602, increasing the volume of the speaker 161 to a volume level that is closest to, and higher than, the current volume level of the speaker 161.

However, presuming that the current volume level of the speaker 161 is greater than a threshold volume level (e.g. a "YES" decision at the block 904), at the block 906, the controller 200 controls the speaker 161 to a lower volume level (e.g. the remote speaker microphone 150 enters a muted state).

At the block 908, the controller 200 receives input. When the input is received from the switch 128 and/or the switch 168, at the block 910, the controller 200 controls the speaker 161 according to the first ordered list 601. In other words, the remote speaker microphone 150 enters the unmuted state and the volume level is controlled based on input from the switch 128 and/or the switch 168. As described above, control of the volume level, in some implementations, depends on a type of the switch 128 and/or the switch 168 used to control the volume level. The method 900 then repeats from the block 902 when touch input is again received at the touch sensor 163.

However, when the input received at the block 908 is again from the touch sensor 163, at the block 912, the controller 200 controls the speaker 161 according to the second ordered list 602. In other words, the remote speaker microphone 150 enters the unmuted state and the volume level is controlled based on input the touch sensor 163, for example to the next highest volume level 607. The block 908, 912 repeat each successive instance of touch input being received at the touch sensor 163.

In the foregoing specification, specific embodiments have been described. However, one of ordinary skill in the art appreciates that various modifications and changes can be made without departing from the scope of the invention. For example, while single taps at the touch sensor 163 have been described to control the volume level of the speaker 161 to a lowered volume level and/or a muted volume level, in other embodiments, double tapping can also be used to control the volume level of the speaker 161 to a lowered volume level and/or a muted volume level. Indeed, in some of these embodiments, touch input indicative of a double tapping at the touch input (i.e., at touch sensor 163) causes the volume level of the speaker 161 to be controlled to lowered volume level and/or a muted volume level, regardless of a current volume level of the speaker 161. Indeed, in these embodiments, different types of touch input received at the touch sensor 163 may have different effects on the speaker 161. Such touch input can include, but is not limited to, touch input indicative of one or more of a number of taps and length of time touch input is received (e.g. "hold" touch input"). Examples of such combinations of touch input, include, but are not limited to: touch and release, touch and hold, double touch, double touch and hold, triple touch, triple touch and hold, etc. Indeed, using the application 208, for example, different combinations of touch input can control the speaker 161 to different volume levels, for example, volume levels in the list 602. Alternatively, a given combination of touch input may control the remote speaker microphone 150 between the speaker mode and the microphone mode. Indeed, other types of actions to which the device 100 and/or the remote speaker microphone 150 may be controlled, for different combinations of touch input, will occur to persons of skill in the art.

Hence, provided herein is a remote speaker microphone with a touch sensor that provides touch volume control. The touch sensor is used to lower the volume of a speaker of the remote speaker microphone to provide convenient muting of the speaker, for example for emergency workers, tour operators and the like.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

I claim:

1. A remote speaker microphone apparatus comprising:
a housing; a microphone; a speaker; an interface configured to connect the speaker and the microphone; and,
a touch sensor configured to, in response to receiving touch input, control a volume level of the speaker from a first volume level to a lower volume level, the first volume level being one of a plurality of discrete volume levels, wherein the touch sensor is further configured to control the volume level of the speaker to the lower volume level only while the touch input is being received at the touch sensor, the speaker returning to the first volume level when the touch input is no longer being received at the touch sensor.

2. The remote speaker microphone apparatus of claim 1, wherein the touch sensor is integrated into a surface of the housing adjacent the speaker.

3. The remote speaker microphone apparatus of claim 1, further comprising a volume adjustment circuit in communication with the touch sensor and the speaker, the volume adjustment circuit configured to perform volume adjustment of the speaker in response to the touch sensor receiving the touch input.

4. The remote speaker microphone apparatus of claim 1, wherein the touch sensor and the speaker are in communication with a volume adjustment circuit located at a communication device via the interface, the volume adjustment circuit at the communication device configured to perform volume adjustment of the speaker in response to the touch sensor receiving the touch input.

5. The remote speaker microphone apparatus of claim 1, further comprising a visual indicator configured to provide a status of the volume level of the speaker.

6. The remote speaker microphone apparatus of claim 1, further comprising:

a mechanically actuated switch configured to control the volume level of the speaker to one of the plurality of discrete volume levels, the lower volume level, to which the speaker is controlled when the touch input is received at the touch sensor, comprising: one of the plurality of discrete volume levels; or an alternate volume level different from the plurality of discrete volume levels.

7. The remote speaker microphone apparatus of claim 1, further comprising:

a mechanically actuated switch configured to, in response to receiving input, select the volume level of the speaker from among the plurality of discrete volume levels, the plurality of discrete volume levels comprising a first ordered list of pre-determined volume levels, touch sensor further configured to, in response to receiving further touch input, select the volume level of the speaker from among a second ordered list of pre-determined volume levels different from the first ordered list of pre-determined volume levels, the second ordered list of pre-determined volume levels comprising the lower volume level.

8. The remote speaker microphone apparatus of claim 7, wherein the touch sensor is configured to, when the mechanically actuated switch was last used to select the volume level of the speaker, control the volume level of the speaker from the first volume level to the lower volume level when touch input is received at the touch sensor, only when the first volume level is above a threshold volume level.

9. The remote speaker microphone apparatus of claim 7, wherein the mechanically actuated switch comprises one of a rotary switch, a rocker switch or a toggle switch.

10. A remote speaker microphone apparatus comprising:

a housing; a microphone; a speaker; an interface configured to connect the speaker and the microphone;

a mechanically actuated switch configured to, in response to receiving input, select a volume level of the speaker from among a first ordered list of pre-determined volume levels; and a touch sensor configured to, in response to receiving touch input, select the volume level of the speaker from among a second ordered list of pre-determined volume levels different from the first ordered list of pre-determined volume levels.

11. A method for controlling a remote speaker microphone apparatus, the method comprising:

receiving, using a touch sensor at the remote speaker microphone apparatus, touch input; and, in response, controlling a volume level of a speaker of the remote speaker microphone apparatus from a first volume level to a lower volume level, the first volume level being one of a plurality of discrete volume levels, wherein the controlling the volume level of the speaker of the remote speaker microphone apparatus from the first volume level to the lower volume level occurs only when the first volume level of the speaker is above a threshold volume level.

12. The method of claim 11, further comprising: controlling the volume level of the speaker to the lower volume level only while the touch input is being received at the touch sensor; and when the touch input is no longer being received at the touch sensor, returning the speaker to the first volume level.

13. The method of claim 11, further comprising: after the touch input is no longer being received at the touch sensor, maintaining the volume level of the speaker at the lower volume level; and, thereafter, when second touch input is received at the touch sensor, controlling the volume level of the speaker back to the first volume level.

14. A method for controlling a remote speaker microphone apparatus, the method comprising:

receiving, using a touch sensor at the remote speaker microphone apparatus, touch input; and, in response, controlling a volume level of a speaker of the remote speaker microphone apparatus from a first volume level to a lower volume level, the first volume level being one of a plurality of discrete volume levels, wherein the remote speaker microphone apparatus further comprises a mechanically actuated switch configured to, in response to receiving input, select the volume level of the speaker from among a first ordered list of pre-determined volume levels, and wherein the controlling the volume level of the speaker of the remote speaker microphone apparatus from the first volume level to the lower volume level comprises: selecting the volume level of the speaker from among a second ordered list of pre-determined volume levels different from the first ordered list of pre-determined volume levels.

15. The method of claim 14, wherein, when the touch sensor is last used to control the volume level of the speaker, and the mechanically actuated switch is next used to control the volume level of the speaker, selecting the volume level of the speaker from among the first ordered list of pre-determined volume levels.

16. The method of claim 15, wherein the mechanically actuated switch comprises a rotary switch of a type without continuous rotation, having stops, the selecting the volume level of the speaker from among the first ordered list of pre-determined volume levels comprises starting the selecting from a given volume level in the first ordered list corresponding to a current angular position of the rotary switch.

17. The method of claim 15, wherein the mechanically actuated switch comprises one of a rocker switch and continuous rotation type a rotary switch, the selecting the volume level of the speaker from among the first ordered list of pre-determined volume levels comprises starting the selecting from a given volume level in the first ordered list closest to a current volume level selected from the second ordered list.

* * * * *